United States Patent
Jones et al.

(10) Patent No.: US 6,337,492 B1
(45) Date of Patent: *Jan. 8, 2002

(54) SERIALLY-CONNECTED ORGANIC LIGHT EMITTING DIODE STACK HAVING CONDUCTORS SANDWICHING EACH LIGHT EMITTING LAYER

(75) Inventors: Gary W. Jones; Webster E. Howard, both of Lagrangeville, NY (US)

(73) Assignee: eMagin Corporation, Hopewell Junction, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/074,423

(22) Filed: May 8, 1998

Related U.S. Application Data

(60) Provisional application No. 60/049,070, filed on Jul. 11, 1997.

(51) Int. Cl.$^7$ ................................................ H01L 31/00
(52) U.S. Cl. ......................... 257/40; 257/89; 313/503; 313/504
(58) Field of Search ............................ 257/40, 88, 89; 313/504, 505

(56) References Cited

U.S. PATENT DOCUMENTS

| | | |
|---|---|---|
| 4,539,507 A | 9/1985 | VanSlyke et al. |
| 4,775,820 A * | 10/1988 | Eguchi et al. ............... 313/504 |
| 5,045,896 A * | 9/1991 | Ash et al. ...................... 357/17 |
| 5,047,687 A | 9/1991 | VanSlyke |
| 5,059,861 A | 10/1991 | Littman et al. |
| 5,059,863 A | 10/1991 | Tashiro et al. |
| 5,077,588 A * | 12/1991 | Yamada et al. ............... 357/17 |
| 5,093,698 A | 3/1992 | Egusa |
| 5,104,749 A | 4/1992 | Sato et al. |
| 5,198,690 A | 3/1993 | Kitagawa et al. |
| 5,247,226 A | 9/1993 | Sato et al. |
| 5,276,381 A | 1/1994 | Wakimoto et al. |
| 5,294,810 A | 3/1994 | Egusa et al. |
| 5,331,182 A | 7/1994 | Takimoto et al. |
| 5,343,050 A * | 8/1994 | Egusa et al. .................. 257/40 |
| 5,374,489 A | 12/1994 | Imai et al. |
| 5,399,936 A | 3/1995 | Namiki et al. |
| 5,456,988 A | 10/1995 | Sano et al. |
| 5,457,565 A | 10/1995 | Namiki et al. |
| 5,482,896 A | 1/1996 | Tang |
| 5,487,953 A | 1/1996 | Shirota et al. |
| 5,518,825 A | 5/1996 | Murayama et al. |
| 5,530,269 A | 6/1996 | Tang |
| 5,593,788 A | 1/1997 | Shi et al. |

(List continued on next page.)

FOREIGN PATENT DOCUMENTS

| | | |
|---|---|---|
| EP | 0 390 551 | 10/1990 |
| WO | WO 96 19792 | 6/1996 |

OTHER PUBLICATIONS

Tada et al., Multicolor Organic Electroluminescent Device Utilizing Vapor–Deposited Fluorescent Dye Films, IEEE Transactions on Electron Devices, vol. 44, No. 8, Aug. 1997.*

*Primary Examiner*—Eddie Lee
*Assistant Examiner*—Bradley W. Baumeister
(74) *Attorney, Agent, or Firm*—Collier Shannon Scott, PLLC

(57) ABSTRACT

The light emitting device comprises a plurality of stacked organic light emitting devices. The plurality of organic light emitting devices are arranged in a stack. The light emitting device further includes a controller for controlling operation of each of the plurality of organic light emitting devices in the stack. The controller supplies the same current to each of the organic light emitting devices in the stack. The controller simultaneously supplies the same current to each of the plurality of the organic light emitting devices.

19 Claims, 3 Drawing Sheets

U.S. PATENT DOCUMENTS

| | | | |
|---|---|---|---|
| 5,598,059 A | | 1/1997 | Sun et al. |
| 5,663,573 A | * | 9/1997 | Epstein et al. ............... 257/40 |
| 5,707,745 A | * | 1/1998 | Forrest et al. ............... 257/89 |
| 5,721,160 A | * | 2/1998 | Forrest et al. ............... 438/28 |
| 5,739,552 A | * | 4/1998 | Kimura et al. ............... 257/89 |
| 5,757,026 A | * | 5/1998 | Forrest et al. ............... 257/40 |
| 5,837,391 A | * | 11/1998 | Utsugi ............... 428/690 |

* cited by examiner

SERIALLY-CONNECTED ORGANIC LIGHT EMITTING DIODE STACK HAVING CONDUCTORS SANDWICHING EACH LIGHT EMITTING LAYER

CROSS REFERENCE TO RELATED PATENT APPLICATION

This application relates to and claims priority on Application Ser. No. 60/049,070 filed on Jul. 11, 1997.

FIELD OF THE INVENTION

The present invention relates to organic light emitting devices. In particular, the present invention relates to a stacked organic light emitting device having high brightness and high efficiency.

BACKGROUND OF THE INVENTION

Organic light emitting devices ("OLEDs") have been known for approximately two decades. All OLEDs work on the same general principles. One or more layers of semiconducting organic material is sandwiched between two electrodes. An electric current is applied to the device, causing negatively charged electrons to move into the organic material(s) from the cathode. Positive charges, typically referred to as holes, move in from the anode. The positive and negative charges meet in the center layers (i.e., the semiconducting organic material), combine, and produce photons. The wave-length—and consequently the color—of the photons depends on the electronic properties of the organic material in which the photons are generated.

The color of light emitted from the organic light emitting device can be controlled by the selection of the organic material. White light is produced by generating blue, red and green lights simultaneously. Specifically, the precisely color of light emitted by a particular structure can be controlled both by selection of the organic material, as well as by selection of dopants.

Organic light emitting devices have been shown to be capable of emitting with very high brightnesses (>$10^5$ cd/m2) and with high quantum efficiencies (2–3%). Unfortunately, the highest brightnesses are achieved with a proportionate reciprocal decrease in lifetime of the device. Also, when power efficiency is considered, operating an OLED at high brightness (and therefore high current) leads to a reduction of power efficiency, as the devices have a significant series resistance, so that the power efficiency drops with increasing current density.

Although substantial progress has been made in the development of OLEDs to date, substantial additional challenges remain. For example, the class of devices continues to face a general series of problems associated with their long-term stability. In particular, the sublimed organic film may undergo recrystallization or other structural changes that adversely effect the emissive properties of the device.

OBJECTS OF THE INVENTION

It is therefore an object of the present invention to provide an OLED possessing higher brightness.

Another object of the present invention is to provide an OLED with higher power efficiency.

A further object of the present invention is to provide an OLED with an increased lifetime.

Yet another object of the present invention is to provide an OLED with a low heat output.

A further object of the present invention is to provide an OLED with increased light output utilizing approximately the same power as a single conventional light emitting device.

Yet another object of the present invention is to provide a transparent stackable OLED structure without requiring independent control of each of the stacked individual OLEDs.

An additional object of the present invention is to provide a transparent stacked OLED structure which draws no more current than a single OLED, but results in an increased brightness.

Yet a further object of the present invention is to provide a device with increased brightness over that of a single OLED, without loss of efficiency or loss of lifetime.

An additional object of the present invention is to provide the same brightness as a single OLED, but with increased efficiency and increased lifetime.

Additional benefits and advantages of the present invention will be apparent to those of ordinary skill in the art.

SUMMARY OF THE INVENTION

The present invention is directed to a light emitting device comprising a plurality of organic light emitting devices. The plurality of organic light emitting devices are arranged in a stack. The light emitting device further includes control means for controlling operation of each of the plurality of organic light emitting devices in the stack. The control means supplies the same current to each of the organic light emitting devices in the stack. The control means simultaneously supplies the same current to each of the plurality of the organic light emitting devices.

The plurality of organic light emitting devices includes at least two stacked organic light emitting devices. The stack of organic light emitting devices is formed on the substrate. The first organic light emitting device of the plurality of organic light emitting devices is located on the substrate. A second organic light emitting device of the plurality of organic light emitting devices is located on the first organic light emitting device.

The light emitting device may further include an insulator layer positioned between each of the organic light emitting devices.

Each of the organic light emitting devices includes a first conductor layer, an OLED layer, and a second conductor layer. The OLED layer is sandwiched between the first and second conductor layers. The thickness of the second conductor layer of the third organic light emitting device is greater than the thickness of the second conductor layers of the first and second organic light emitting devices.

The light emitting device according to the present invention has increased brightness capability. The light emitting device according to the present invention also has increased efficiency and lifetime.

It is to be understood that both the foregoing general description and the following detailed description are exemplary and explanatory only. The description is not considered to be restrictive of the invention as claimed.

BRIEF DESCRIPTION OF THE DRAWINGS

The present invention will now be described in connection with the following figures in which like reference numbers refer to like elements and wherein.

DETAILED DESCRIPTION OF THE PREFERRED EMBODIMENTS

The present invention is directed to an improved light emitting device 1 that includes stacked organic light emitting devices. The device 1 includes a substrate 2. The substrate 2 may be formed from glass (e.g., borosilicate glass), silicon on quartz, plastic or other suitable substrate material.

A plurality of individual organic light emitting devices 10, 20, and 30 are formed on the substrate 2. A current source 3 supplies current to the plurality of individual organic light emitting devices 10, 20, and 30. The present invention is described, for purpose of example, as containing three stacked individual organic light emitting devices. It, however, is contemplated by the present inventors that the present invention is not limited to three stacked organic light emitting devices. Rather, two stacked light emitting devices and more than three stacked emitting devices are all considered to be within the scope of the present invention.

Figure 1:
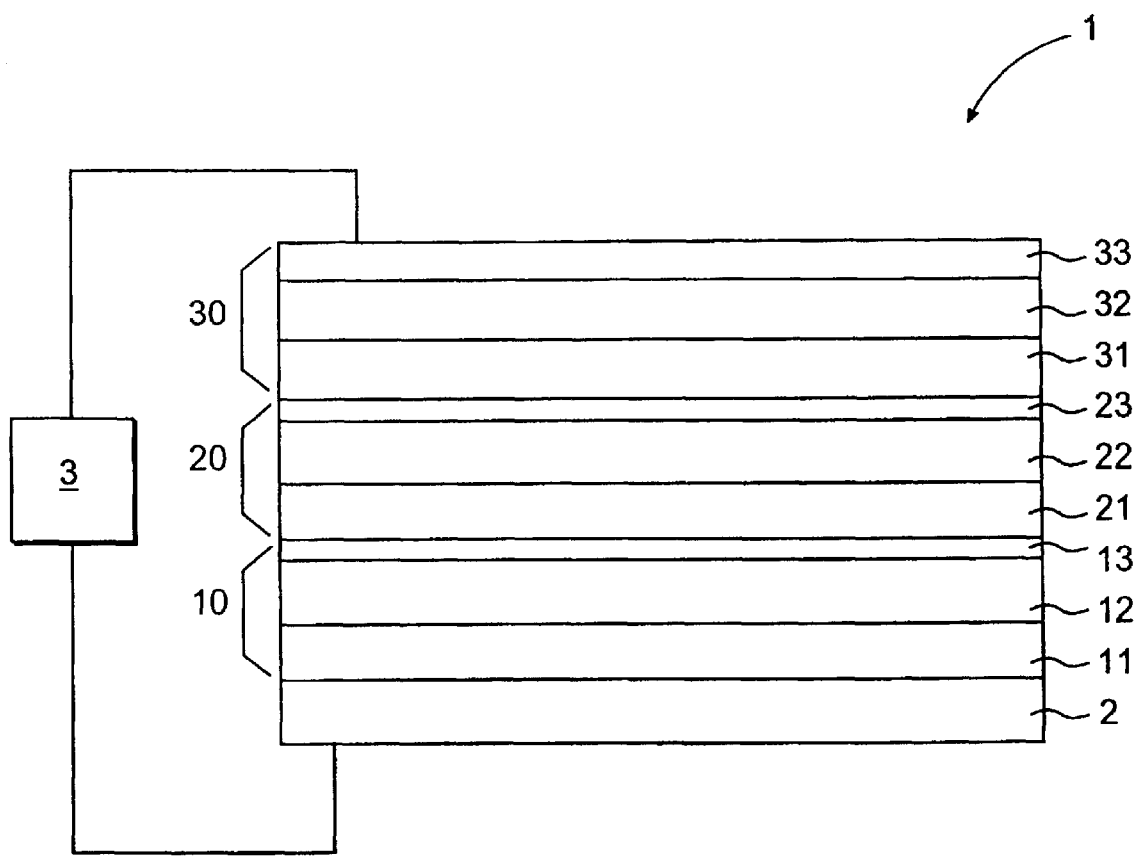
FIG. 1 is a side view of a stacked organic light emitting device according to an embodiment of the present invention.

As shown in FIG. 1, a first organic light emitting device 10 is formed on the substrate 2. The first organic light emitting device 10 includes a first conductor layer 11. The first conductor layer 11 is preferably formed as lines or, in the case of an active matrix substrate, electrode pads, directly on the substrate 2 using conventional techniques (e.g., screen coated or lithographically patterned using conventional photoresist and etching techniques). The conductor layer 11 is preferably transparent and formed from a mixture of indium oxide and tin oxide or indium tin oxide (ITO). However, it is contemplated that other suitable light transmissive electrically conductive materials may be used to construct the first conductor layer 11. Thin 90% Mg+10% Ag (e.g. 10 nm) and LiF (1 nm) over Al (10 nm) could be used as transparent electrodes for an inverted OLED stack. 50 nm of ITO on 100 nm of Al+4% Cu or much thicker films of previously mentioned materials could be used for upwardly emitting versions of the present invention. Pixel areas, not shown, are then formed on the first conductor layer 11 by depositing an insulator layer on the first conductor layer 11 using conventional techniques.

An OLED layer 12 is then deposited on the insulator layer and first conductor layer 11 such that the OLED layer 12 contacts the first conductor layer 11 in the pixel area, as shown in FIG. 1. The OLED layer 12 preferably comprises one or more layers of organic film(s). Preferably, the OLED layer 12 includes a hole transport layer, at least one light emitting layer and an electron transport layer. The light emitting layer is sandwiched between the hole transport layer and electron transport layer. The OLED layer 12 is preferably transparent.

A thin second conductor layer 13 is formed on the OLED layer 12. The second conductor layer 13 is preferably transparent and formed from a metal (e.g., Mg and Ag alloys or Al and Cu and Ti alloys, molybdenum, cobalt, nickel, zinc, or indium) or diamond like carbon (DLC), ITO, SiC, CuPc,. In a preferred embodiment, the second conductor layer 13 has a thickness in the range of 1 to 150 Angstroms. A thin ion damaged layer of CuPc or Alq may be used as a recombination injection site. The second conductor layer 13 should be sufficiently thin to minimize light absorption and discontinuous to limit lateral conduction. Otherwise, the conductor layer 13 will short sideways to other pixels. If the second conductor layer 13 is a discontinuous film, a thickness of 1 to 2 Angstroms may be acceptable for charge generation. If the second conductor layer 13 is patterned, then it may have a thickness in the range of 50 to 150 Angstroms. When an electric current is applied to the device, negatively charged electrons are generated and move into the OLED layer 12 from the second conductor layer 13. Positive charges or holes are generated and move into the OLED layer 12 from the first conductor layer 11. The electrons and holes meet in the OLED layer 12, where they combine and produce photons.

A second organic light emitting device 20 is formed on the first organic light emitting device 10. The second organic light emitting device 20 includes a first conductor layer 21. The conductor layer 21 is preferably formed from the same materials as described above in connection with conductor layer 11.

An OLED layer 22 is then deposited on the first conductor layer 21 such that the OLED layer 22 contacts the first conductor layer 21 in the pixel area. As described above in connection with OLED layer 12, the OLED layer 22 preferably comprises one or more layers of organic film.

A thin second conductor layer 23 is formed on the OLED layer 22. The second conductor layer 23 is also preferably transparent and formed from a metal, as described above in connection with the second conductor layer 13.

In the embodiment of the present invention illustrated in FIG. 1, the first conductor layer 21 of the second organic light emitting device 20 may be formed directly on the thin second conductor layer 13 of the first organic light emitting device 10. In this manner, nonmetallic electron and hole injector layers may be used. It is advisable to shadow mask the thin metal layers so that they are smaller than the organic layers. For pixel isolation, the metal layers may not be continuous to prevent sideways shorting, as described above.

The OLED stack order can be inverted and will still work if the voltages are reversed. Light can be emitted from either the top electrode, bottom electrode, or both sides of the device by selecting suitable thicknesses for the top and bottom layers, the use of thick reflective, transmissive, or absorbing conductors on top or bottom of the stack.

Figure 2:
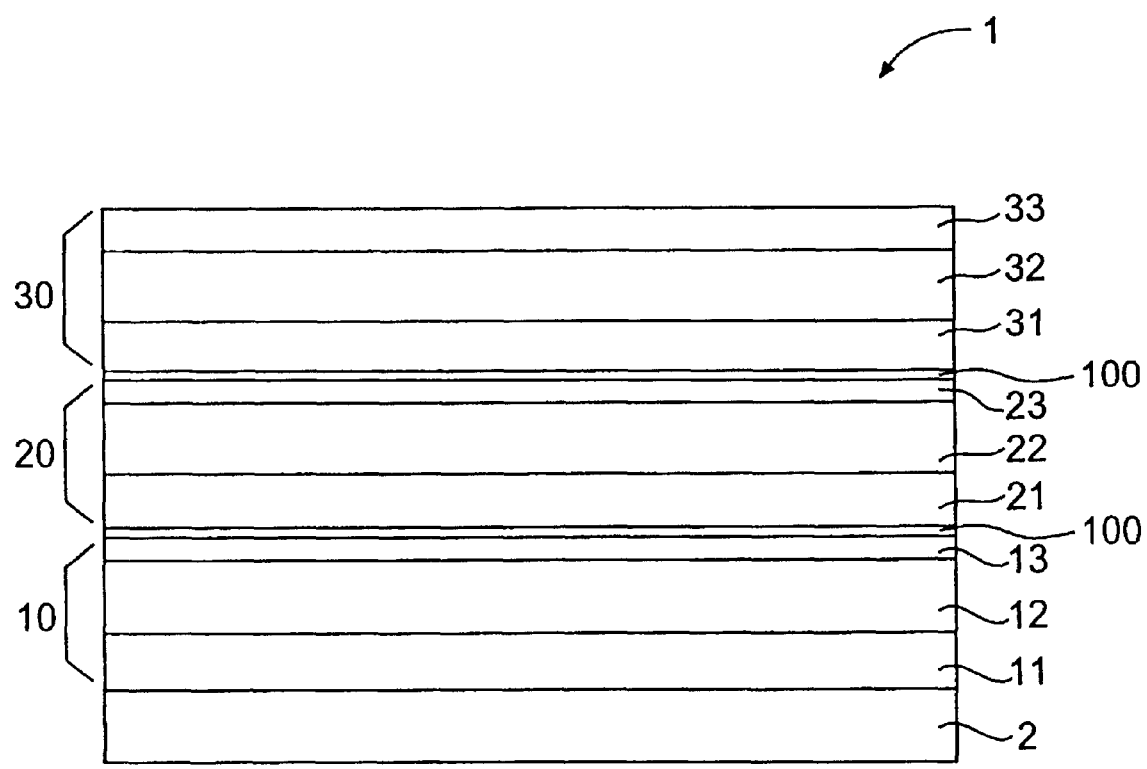
FIG. 2 is a side view of a stacked organic light emitting device according to another embodiment of the present invention.

Another embodiment of the present invention, illustrated in FIG. 2, includes a thin insulator material 100, as shown in FIG. 2, deposited over the thin second conductor layer 13 prior to formation of the first conductor layer 21 to provide an insulative barrier between the first and second organic light emitting devices 10 and 20. The insulator layer 100 may be formed from suitable dielectric materials such as SiO, aluminum oxide, silicon nitride, and diamond like carbon films.

Figure 3:
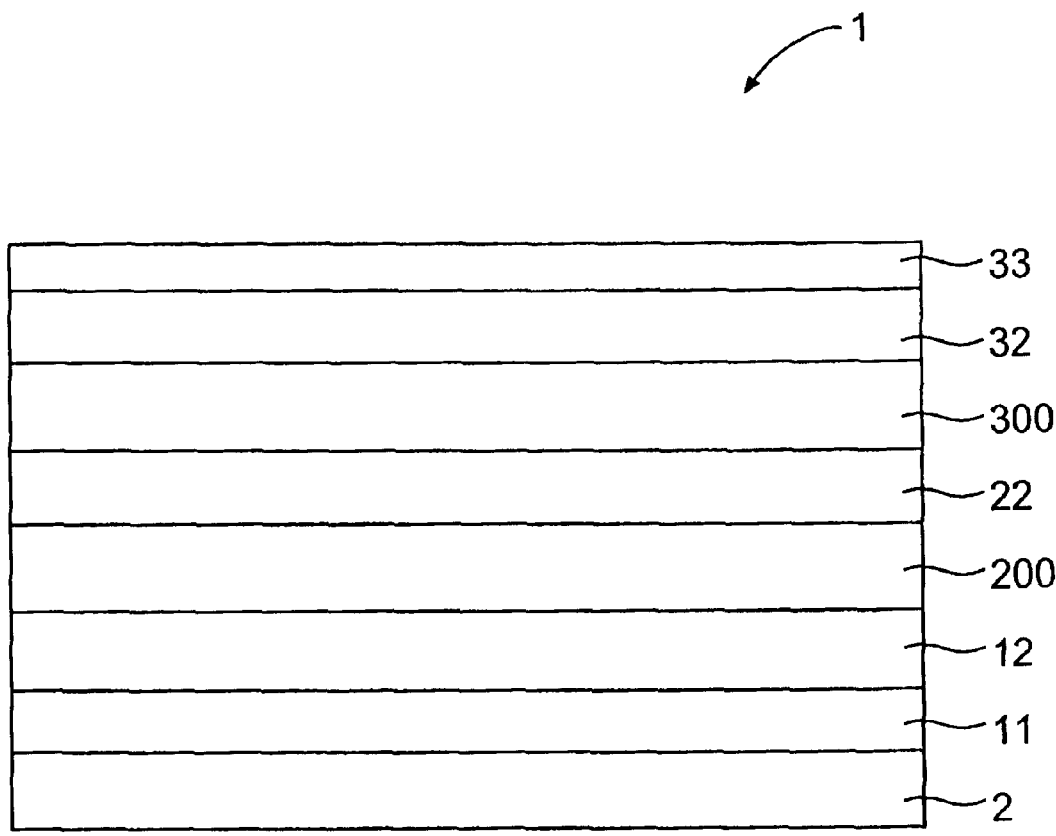
FIG. 3 is a side view of a stacked organic light emitting device according to another embodiment of the present invention.

Another embodiment of the present invention is illustrated in FIG. 3. In this embodiment, the thin second conductor layer may be simultaneously formed with the first conductor layer as a single semiconductor layer 200 having a concentration gradient such that a p-n junction is formed having a high reverse leakage current. This may be accomplished by, for example, chemical vapor deposition whereby the concentration of the material forming the second conductor portion 213 of the single layer 200 is highest (approximately 100%) adjacent the OLED layer 12. The concentration of the material forming the second conductor portion 213 decreases as the distance from the OLED layer 12 increases. The concentration of the material forming the first conductor portion 221 of the single layer 200 is highest (approximately 100%) adjacent the OLED layer 22. Similarly, the concentration of the material forming the first portion 221 decreases as the distance from the OLED layer 22 increases. Electrons generated in the layer 200 move downward into the OLED layer 12. Holes generated in the layer 200 move upward into the OLED layer 22.

A third organic light emitting device 30 is formed on the second organic light emitting device 20, as shown in FIG. 1. The third organic light emitting device 30 includes a first conductor layer 31. The transparent conductor layer 31 is preferably formed from a mixture such as indium oxide and tin oxide, (ITO), also indium zinc oxide (IZO), or indium aluminum oxide (IAO). A thin metal layer such as Mo (~100 Å) may also be used. However, it is contemplated that other suitable transparent light transmissive electrically conductive materials may be used to construct the first conductor layer 31.

An OLED layer 32 is then deposited on the first conductor layer 31 such that the OLED layer 32 contacts the first conductor layer 31 in the pixel area. As described above in connection with OLED layer 12, the OLED layer 32 preferably comprises one or more layers of organic film.

A second conductor layer 33 is formed on the OLED layer 32. The second conductor layer 33 is also preferably formed from a metal, as described above in connection with the second conductor layer 13. In a preferred embodiment, the second conductor layer 33 has a thickness in the range of 1 to 100 Angstroms. The thinnest possible film of conductor permits minimum cross-talk between pixels. Discontinuous films are preferred.

The first conductor layer 31 of the third organic light emitting device 30 may be formed directly on the thin second conductor layer 23 of the second organic light emitting device 20. Alternatively, a thin insulator material 100, as described above, may be formed between the thin second conductor layer 23 and the first conductor layer 31 to provide an insulative barrier between the second and third organic light emitting devices 20 and 30, as shown in FIG. 2. Alternatively, the thin second conductor layer may be simultaneously formed with the first conductor layer as single semiconductor layer 300 having a concentration gradient, as described above, with a first conductor layer portion 331 and a second conductor layer portion 323.

A current from a current source 3 is equally applied to each of the individual organic light emitting devices 10, 20, and 30. The current controls the current density. There is no independent control of the current applied to each of the individual organic light emitting devices 10, 20, and 30. Light emitted from the third organic light emitting device 30 passes through the first and second organic light emitting devices 10 and 20 and the substrate 2. Similarly, light emitted from the second organic light emitting device 20 passes through the first organic light emitting device 10 and substrate 2. Light from the second and third organic light emitting devices 20 and 30 are partially impeded as the light passes through adjacent organic light emitting devices, as described above.

This arrangement produces a light emitting device 1 that is brighter than conventional single organic light emitting devices when the same current is applied. For example, for an organic light emitting device that is 80% transparent, 64% of the light emitted from the third organic light emitting device 30 is transmitted through the substrate 2. 80% of the light emitted from the second organic light emitting device 20 is transmitted through the substrate 2. 100% of the light emitted from the first organic light emitting device 10 is transmitted through the substrate 2. The brightness of light emitted from the present invention is increased by almost a factor of 3 over the conventional single organic light emitting device. This produces only a loss in power efficiency of about 20% as compared to as much as 60% for a conventional device operating at the same brightness with an ohmic series resistance. Furthermore, the light emitting device 1 would have the same power efficiency and lifetime as a single organic light emitting device of the same current density. Alternatively, the present invention produces a light emitting device 1 that produces the same brightness as a conventional organic light emitting device but at increased efficiency and improved lifetime because less current is required to produce the desired brightness.

While the lack of independent control of the layers may be initially perceived as a drawback of the present invention, those persons skilled in the art will quickly appreciate that a higher brightness will result with no additional current requirement resulting in an increased power efficiency and a lower heat output. The present invention, therefore, provides greater flexibility in increased brightness for an equivalent lifetime, or equivalent brightness for an increased lifetime. That flexibility makes the present invention superior to conventional organic light emitting devices.

In addition, it will be apparent to those skilled in the art that various modifications and variations can be made in the construction and configuration of the present invention without departing from the scope or spirit of the invention. For example, in the embodiment mentioned above, various changes may be made in the transparent materials or number of OLED layers, all while preserving the function of the present invention as described herein. The organic light emitting devices may each be different colors, so that the colors may be mixed in a fixed proportion to provide a white emitter. Similarly, the light emitter device may be a top emitter. In such an arrangement, the transparent first conductor layer 11 may be replaced with a reflective conductor to direct the light upward. Further, it may be appropriate to make various modifications in materials of the present invention, or in the mode of operation of a preferred embodiment of the present invention. Thus, it is intended that the present invention cover the modifications and variations of the invention, provided they within the scope of the appended claims and their equivalents.

Additionally, the order of the first and second conductor layers may be reversed with a top transparent sputtered electrode of ITO on CuPc, Alq or thin metal (Al+Li or Mg+Ag, for example).

Additionally, it may be possible to stack the organic light emitting devices without including the intermediate conductor layers.

Additionally, it is possible to coevaporate the injector metal layers with the organic materials. This may permit better recombination and injection of the charges with minimal lateral conduction.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A light emitting device comprising:
a substrate having a surface;
a stack of organic light emitting devices comprising at least a first organic light emitting device and an uppermost organic light emitting device, wherein each organic light emitting device comprises:
a first conductor layer having an upper and a lower surface,
an OLED layer comprising at least one organic layer and having an upper and a lower surface, wherein the lower surface of the OLED layer is in contact with the upper surface of the first conductor layer, and
a second conductor layer having an upper surface and a lower surface, wherein the lower surface of the second conductor layer is in contact with the upper surface of the OLED layer,
wherein the lower surface of the first conductor layer of the first organic light emitting device is in contact with the surface of the substrate, and wherein the lower surface of the first conductor of each subsequent organic light emitting device is in contact with the upper surface of the second conductor of an organic light emitting device directly below it in the stack; and
a direct current source for supplying current to the stack of organic light emitting devices wherein the current source applies a voltage between the first conductor layer of the first organic light emitting device and the second conductor layer of the uppermost organic light emitting device with the electrical circuit being completed by an electrical current flowing directly through the stack.

2. The light emitting device according to claim 1 wherein the first conductor layer of each subsequent organic light emitting device and the second conductor layer of an organic light emitting device directly below it in the stack are formed as a single layer.

3. The light emitting device according to claim 1 wherein the first conductor layers comprise one or more materials independently selected from a mixture of indium oxide with tin oxide, indium tin oxide, 90 percent Mg with 10 percent Ag, LiF over Al, ITO on Al with 4 percent Cu, indium zinc oxide, and molybdenum.

4. The light emitting device according to claim 1 wherein the first conductor layers comprise one or more materials independently selected from a mixture of indium oxide with tin oxide, and indium tin oxide.

5. The light emitting device according to claim 1 wherein the second conductor layers comprise a material independently selected from a metal, diamond-like carbon, ITO, SiC and CuPc.

6. The light emitting device according to claim 1 wherein the second conductor layers comprise a metal.

7. The light emitting device according to claim 1 wherein the second conductor layers comprise one or more metals independently selected from a Mg/Ag alloy, a Al/Cu/Ti alloy, molybdenum, cobalt, nickel and indium.

8. The light emitting device according to claim 1 wherein the second conductor layers have a thickness of 1 to 150 Angstroms.

9. The light emitting device according to claim 1 wherein the second conductor layers are patterned and have a thickness of 50 to 150 Angstroms.

10. The light emitting device according to claim 1 wherein the second conductor layers comprise a layer of a material selected from CuPc or Alq.

11. The light emitting device according to claim 1 wherein the second conductor layers comprise a discontinuous film.

12. The light emitting device according to claim 11 wherein the discontinuous film has a thickness of 1 to 2 Angstroms.

13. The light emitting device according to claim 1 wherein the first conductor layer of the uppermost organic light emitting device and the second conductor layer of the organic light emitting device below it in the stack together comprise a single semiconductor layer having a concentration gradient of a material forming a first conductor portion and a material forming a second conductor portion, wherein the concentration of the material forming the second conductor portion is highest near the OLED layer of the organic light emitting device lower in the stack and the concentration of the material forming the first conductor portion is highest near the OLED layer of the organic light emitting device higher in the stack.

14. The light emitting device according to claim 1 wherein the OLED layers comprise a hole transport layer, at least one light emitting layer, and an electron transport layer.

15. The light emitting device according to claim 1 wherein the substrate comprises an active matrix substrate and the first conductor layer of the first organic light emitting device comprises electrode pads.

16. The light emitting device according to claim 1 wherein the stack consists of a first organic light emitting device, a second organic light emitting device, and an uppermost organic light emitting device.

17. The light emitting device according to claim 16 wherein each of the second conductor layers of the organic light emitting devices has a thickness, wherein the thickness of the second conductor layer of the uppermost organic light emitting device is greater than the thickness of the second conductor layers of the first and second organic light emitting devices.

18. The light emitting device according to claim 1 wherein each of the organic light emitting devices emits a light of a different color.

19. The light emitting device according to claim 1 wherein the second conductor layer of the uppermost organic light emitting device comprises a metal, and the second conductor layers of all other organic light emitting devices in the stack comprise a bilayer of an electron injector and hole injector.

* * * * *